(12) United States Patent
Song et al.

(10) Patent No.: US 9,536,940 B2
(45) Date of Patent: Jan. 3, 2017

(54) INTERFACIAL MATERIALS FOR USE IN SEMICONDUCTOR STRUCTURES AND RELATED METHODS (71) Applicant: Micron Technology, Inc., Boise, ID (US)

(72) Inventors: Zhe Song, Boise, ID (US); Jennifer K. Sigman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 309 days.

(21) Appl. No.: 13/622,667

(22) Filed: Sep. 19, 2012

(65) Prior Publication Data
US 2014/0080283 A1 Mar. 20, 2014

(51) Int. Cl.
*H01L 21/00* (2006.01)
*H01L 49/02* (2006.01)
*H01G 4/008* (2006.01)
*H01L 27/108* (2006.01)
*H01G 4/33* (2006.01)
*H01L 21/02* (2006.01)

(52) U.S. Cl.
CPC .............. *H01L 28/75* (2013.01); *H01G 4/008* (2013.01); *H01G 4/33* (2013.01); *H01L 21/02189* (2013.01); *H01L 21/02271* (2013.01); *H01L 21/02362* (2013.01); *H01L 27/10852* (2013.01)

(58) Field of Classification Search
CPC .................... H01L 21/02189; H01L 21/02271; H01L 21/02362
See application file for complete search history.

(56) References Cited

U.S. PATENT DOCUMENTS

| 5,332,684 | A | * | 7/1994 | Yamamichi et al. | 438/396 |
| 6,010,940 | A | | 1/2000 | Lee et al. | |
| 6,214,714 | B1 | | 4/2001 | Wang et al. | |
| 6,238,964 | B1 | | 5/2001 | Cho | |
| 6,284,050 | B1 | * | 9/2001 | Shi et al. | 118/715 |
| 6,620,713 | B2 | | 9/2003 | Arghavani et al. | |
| 6,693,004 | B1 | | 2/2004 | Halliyal et al. | |
| 6,803,272 | B1 | * | 10/2004 | Halliyal et al. | 438/240 |
| 6,858,524 | B2 | | 2/2005 | Haukka | |
| 6,900,498 | B2 | * | 5/2005 | Stauf et al. | 257/310 |
| 6,911,391 | B2 | | 6/2005 | Yang et al. | |
| 7,074,680 | B2 | * | 7/2006 | Doczy et al. | 438/287 |
| 7,094,685 | B2 | | 8/2006 | Yang et al. | |

(Continued)

FOREIGN PATENT DOCUMENTS

| CN | 101831618 | * | 9/2010 |
| WO | 2011049816 A2 | | 4/2011 |

OTHER PUBLICATIONS

Borodin et al., Characterizing TiO2(110) Surface States by Their Work Function, Phys. Chem. Chem. Phys., vol. 13, pp. 15442-15447 (2011).

(Continued)

*Primary Examiner* — Richard Booth
(74) *Attorney, Agent, or Firm* — TraskBritt (57) ABSTRACT

A method of forming a semiconductor structure. The method comprises forming a high-k dielectric material, forming a continuous interfacial material over the high-k dielectric material, and forming a conductive material over the continuous interfacial material. Additional methods and semiconductor structures are also disclosed.

22 Claims, 2 Drawing Sheets

(56) References Cited

U.S. PATENT DOCUMENTS

| | | |
|---|---|---|
| 7,122,414 B2 | 10/2006 | Huotari |
| 2001/0003664 A1* | 6/2001 | Yamaguchi .................. 438/240 |
| 2002/0084450 A1 | 7/2002 | Cho |
| 2002/0115252 A1 | 8/2002 | Haukka et al. |
| 2002/0167086 A1* | 11/2002 | Stauf et al. .................. 257/751 |
| 2007/0059910 A1 | 3/2007 | Pei |
| 2009/0050982 A1 | 2/2009 | Pantisano et al. |
| 2010/0044806 A1 | 2/2010 | Hou et al. |
| 2010/0109098 A1 | 5/2010 | Lin et al. |
| 2011/0147795 A1* | 6/2011 | Rachmady et al. .......... 257/192 |
| 2012/0075767 A1 | 3/2012 | Popovici et al. |
| 2012/0077322 A1* | 3/2012 | Hirota et al. ................ 438/381 |
| 2012/0098107 A1 | 4/2012 | Raisanen et al. |
| 2014/0080282 A1* | 3/2014 | Chiang et al. ............... 438/396 |

OTHER PUBLICATIONS

Greiner et al., A Metallic Molybdenum Suboxide Buffer Layer for Organic Electronic Devices, Appl. Phys. Lett., vol. 96, pp. 213302-1-213302-3 (2010).

Yang et al., The Effects of Interfacial Sub-Oxide Transition Regions and Monolayer Level Nitridation on Tunneling Currents in Silicon Devices, IEEE Electron Device Letters, vol. 21, No. 2, Feb. 2000, pp. 76-78.

* cited by examiner

INTERFACIAL MATERIALS FOR USE IN SEMICONDUCTOR STRUCTURES AND RELATED METHODS

TECHNICAL FIELD

The present disclosure, in various embodiments, relates generally to semiconductor device design and fabrication. More particularly, the present disclosure relates to a semiconductor structure including a continuous interfacial material between a high-k dielectric material and a conductive material.

BACKGROUND

Various techniques are known in the art of forming a conductive material over a substrate during fabrication of devices in integrated circuitry. Such techniques include atomic layer deposition (ALD), chemical vapor deposition (CVD), plasma enhanced chemical vapor deposition (PECVD), and other known deposition processes. ALD, CVD, PECVD, and other thin film deposition processes use volatile precursors to form conductive materials of a desired chemical composition on a substrate surface.

Often, the conductive material to be formed is a metal, metal oxide, or a metal nitride material. There may be several possible methods of forming such a material with a particular chemical composition on a substrate surface, however, each method may result in different physical or chemical properties of the as-deposited material. Varying deposition conditions, such as deposition temperature or precursors, may alter the capacitance, leakage current, resistance, or breakdown voltage of the as-deposited material. For instance, using a halogen-containing metal precursor, such as titanium tetrachloride ($TiCl_4$), to form the conductive material may result in damage to underlying materials upon which the conductive material is formed. The halogen-containing metal precursor reacts with the underlying material, such as a high-k dielectric material, causing an interface between the conductive material and the underlying material to be damaged before the conductive material coalesces. For example, when forming a titanium nitride (TiN) material using $TiCl_4$ over a high-k dielectric material, the $TiCl_4$ may react with the high-k dielectric material and form a discontinuous (e.g., non-uniform) titanium oxide and titanium suboxide material between the high-k dielectric material and the TiN material. This discontinuous titanium oxide and titanium suboxide may cause increased leakage current through the dielectric material and may introduce localized micro roughness and state density at the interface between the conductive material and the underlying high-k dielectric material, leading to lower capacitance of a semiconductor device that includes the high-k dielectric material.

Despite these disadvantages, some of these halogen-containing metal precursors exhibit beneficial properties, such as high capacitance of the resulting stack structure. Various solutions have been attempted to overcome these problems including increasing the thickness of the underlying materials to effectively block leakage current, forming the conductive materials with organic precursors, or forming the conductive material at lower process temperatures. However, each of these solutions creates problems such as increased equivalent oxide thickness or a decrease in overall capacitance of the stack structure.

It would be desirable to form a conductive material to increase the overall device capacitance without damaging or etching underlying material or materials. It would also be desirable to form the conductive material using a halogen-containing metal precursor.

DETAILED DESCRIPTION

Methods of forming semiconductor structures having an interfacial material are disclosed, as are semiconductor structures including the interfacial material. The interfacial material may be formed at an interface between a conductive material and a high-k dielectric material of the semiconductor structure. The interfacial material may provide a barrier between the conductive material and the high-k dielectric material. The interfacial material forms a continuous material between the conductive material and the high-k dielectric material. The interfacial material may be formed conformally over the high-k dielectric material. As used herein, the term "continuous" means and includes a material that does not include openings or interruptions therein. The interfacial material is in substantial contact with an upper surface of the high-k dielectric material. Thus, no portions of the high-k dielectric material are exposed through the interfacial material. The interfacial material may be formed at a thickness sufficient to cover the high-k dielectric material yet provide minimal contribution to the overall thickness of the semiconductor structure. The interfacial material may protect underlying materials from undesired chemical reactions or etching during subsequent processing acts. The conductive material may function as an electrode of a capacitor or a high-k gate stack in a semiconductor device.

The methods disclosed improve overall device performance and quality by decreasing current leakage, increasing overall capacitance, and increasing device breakdown voltage of the semiconductor device including the interfacial material. The interfacial material may be sufficiently thin such that it exhibits properties substantially similar to those of the overlying conductive material, rather than those of the high-k dielectric material. The interfacial material may also increase the overall capacitance of the stack structure without substantially increasing the effective oxide thickness or the overall device thickness of the semiconductor structure. The interfacial material may act as a chemical reaction barrier between ALD or CVD metal precursors used to form the conductive material and the high-k dielectric material. The presence of the interfacial material may enable any materials formed above the interfacial material to be formed using halogen-containing metal precursors without damaging or reacting with the high-k dielectric material or any underlying substrate materials. The interfacial material may also enhance the work function and band offset of the conductive material relative to the high-k dielectric film, decreasing current leakage.

The following description provides specific details, such as material types, material thicknesses, and processing conditions in order to provide a thorough description of disclosed embodiments. However, a person of ordinary skill in the art will understand that the embodiments disclosed may be practiced without employing these specific details. Indeed, the disclosed embodiments may be practiced in conjunction with conventional fabrication techniques employed in the industry. In addition, the description provided herein does not form a complete process flow for manufacturing a semiconductor device. Only those process acts and structures necessary to understand the embodiments of the present disclosure are described in detail below. Additional acts to form a complete semiconductor device may be performed by conventional techniques.

The illustrations presented herein are not meant to be actual views of any particular systems, or semiconductor devices, but are merely idealized representations which are employed to describe embodiments of the present disclosure. Elements and features common between figures may retain the same numerical designation.

The structures and methods disclosed may be useful in the processing of any integrated circuit wherein a material may be formed or partially formed from a halogen-containing metal precursor. Particularly, the methods disclosed herein may be useful in any semiconductor device with a capacitor or high-k stack with a high-k dielectric material disposed between opposing electrodes. Although embodiments disclosed herein describe the use of a high-k dielectric material, other dielectric materials may be used, such as $SiO_2$, or other dielectric materials known in the art. The methods disclosed may be useful in semiconductor devices with a gate stack overlying a substrate or doped substrate material. Such devices include, but are not limited to metal oxide semiconductor (MOS) devices, metal oxide semiconductor field effect transistors (MOSFETs), complementary metal-oxide semiconductor (CMOS) transistors, dynamic random access memory (DRAM) devices, semiconductor devices having a metal insulator metal (MIM) capacitor, NAND devices, resistive random access memory (RRAIVI), or any other semiconducting device with an interface between a dielectric material and a metal, metal nitride, or metal oxide, such as in a semiconducting device with a capacitor.

The disclosed methods and structures may be particularly useful in devices and applications where it is desired to prevent direct interactions between the high-k dielectric material and the conductive material without negatively affecting device performance. The disclosed methods and structures are particularly useful when formation of the conductive film would damage the high-k dielectric material by undesired chemical reactions or etching of the high-k dielectric material.

Figure 1:
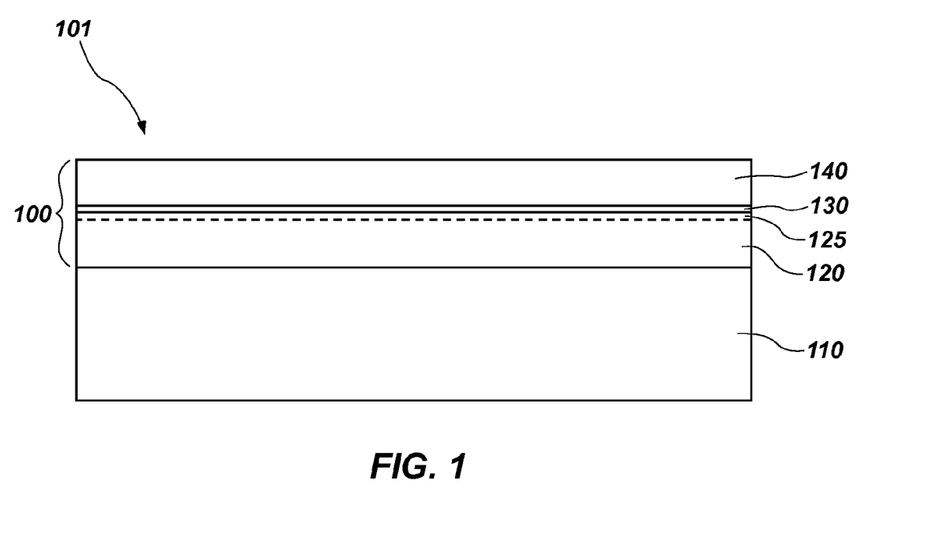
FIG. 1 is a cross-sectional view illustrating an interfacial material in a semiconductor structure according to an embodiment of the present disclosure.

An embodiment of a semiconductor structure 101 including an interfacial material 130 is illustrated in FIG. 1. A stack structure 100 including the interfacial material 130 may be formed on a substrate 110. The stack structure 100 includes a high-k dielectric material 120, the interfacial material 130, and a conductive material 140. The stack structure 100 may include another conductive material (not shown), which may function as a bottom electrode, below the high-k dielectric material 120. The interfacial material 130 may be disposed between the high-k dielectric material 120 and the conductive material 140. Optionally, a capping material 125 may be formed over the high-k dielectric material 120.

To form the semiconductor structure 101, the substrate 110 may be positioned in a deposition chamber, such as an ALD chamber. The substrate 110 may be a conventional silicon substrate or other bulk substrate. As used herein, the term "bulk substrate" includes not only silicon wafers, but also silicon-on-insulator ("SOI") substrates, silicon-on-sapphire ("SOS") substrates, epitaxial layers of silicon on a base semiconductor foundation, and other semiconductor or opto-electronics materials, such as silicon-germanium, germanium, gallium arsenide, or indium phosphide.

The high-k dielectric material 120 may be formed over the substrate 110. The high-k dielectric material 120 may be chosen based on desired properties of the semiconductor structure 101, such as the dielectric constant, equivalent oxide thickness, etc. Non-limiting examples of suitable high-k dielectric materials 120 include, but are not limited to, hafnium oxide ($Hf_yO_x$, such as, for example, $HfO_2$), titanium oxide ($Ti_yO_x$, such as, for example, $TiO_2$), tantalum oxide ($Ta_yO_x$, such as, for example, $Ta_2O_5$), aluminum oxide ($Al_yO_x$, such as, for example, $Al_2O_3$), zirconium oxide ($Zr_yO_x$, such as, for example, $ZrO_2$), niobium oxide ($Nb_yO_x$, such as, for example, $NbO$, $NbO_2$, or $Nb_2O_5$), molybdenum oxide ($Mb_yO_x$, such as, for example, $MoO_2$ or $MoO_3$), ruthenium oxide ($RuO_2$), strontium oxide ($Sr_yO_x$, such as, for example, $SrO$), barium oxide ($Ba_yO_x$, such as, for example, $BaO$), strontium titanium oxide ($SrTiO_3$, also known as STO), magnesium oxide ($Mg_yO_x$, such as, for example, $MgO$), or combinations thereof, wherein y is between one (1) and three (3) and x is between one (1) and seven (7). Other high-k dielectric materials known in the art may be utilized depending on the end use of the semiconductor device. In one embodiment, the high-k dielectric material 120 is $HfO_2$ or $ZrO_2$. The high-k dielectric material 120 may be formed in a single deposition act, such as by ALD, CVD, or other deposition techniques known in the art. The high-k dielectric material 120 may be formed by conventional techniques, which are not described in detail herein.

Optionally, the capping material 125 may be formed over the high-k dielectric material 120. If present, the capping material 125 may cover the upper surface of the high-k dielectric material 120 and seal off pores in the high-k dielectric material 120 to reduce leakage current. The capping material 125 may be a material that limits the amount of diffusion between the high-k dielectric material 120 and any other materials. The capping material 125 may be an aluminum oxide ($AlO_x$), a silicon oxide ($SiO_x$), chromium oxide ($Cr_yO_x$), or other suitable capping material as known in the art. The capping material 125 may be formed by conventional techniques, which are not described in detail herein.

With continued reference to FIG. 1, the interfacial material 130 may be formed over the capping material 125, if present, or over the high-k dielectric material 120. The interfacial material 130 may be in direct contact with the high-k dielectric material 120 or capping material 125, if present. The material of the interfacial material 130 may be selected based on the conductive material 140 to be formed over the interfacial material 130. The material of the interfacial material 130 may be selected such that subsequently formed materials do not react with the high-k dielectric material 120 or any underlying materials. The interfacial material 130 may be formed of a metal oxide, such as an oxide or suboxide of titanium, tantalum, tungsten, molybdenum, niobium, or combinations thereof. In one embodiment, the interfacial material 130 is a titanium oxide. By utilizing combinations of different metal oxides, such as a combination of titanium oxide and tantalum oxide, the work function or band gap of the interfacial material 130 may be tailored as described in more detail below. The electrical properties of the interfacial material 130 relative to the conductive material 140 may be altered by adjusting the oxygen content of the interfacial material 130. A lower oxygen content in the interfacial material 130 may desirably increase the conductance of the interfacial material 130. By way of non-limiting example, an interfacial material 130 formed from a titanium suboxide (such as, for example, TiO) may produce a more conductive material than an interfacial material 130 formed from $TiO_2$.

The interfacial material 130 may be formed at a thickness sufficient to substantially cover the entire surface of the high-k dielectric material 120 or the capping material 125, if present. Thus, the interfacial material 130 may be substantially continuous over the surface of the high-k dielectric material 120 or the capping material 125, if present. The interfacial material 130 may be substantially uniform in thickness. However, the thickness of the interfacial material 130 may not substantially contribute to the overall thickness of the semiconductor structure 101. If the thickness of the interfacial material 130 is too great, an increase in the capacitance of the stack structure 100 may not be observed. The thickness of the interfacial material 130 may range from about a single monolayer to about 20 Angstroms (Å) as long as the resulting interfacial material 130 is continuous over the surface of the high-k dielectric material 120 or the capping material 125, if present. The interfacial material 130 may have a thickness ranging from approximately 1 Å to approximately 20 Å, such as from approximately 1 Å to approximately 5 Å, from approximately 5 Å to approximately 10 Å, or from approximately 10 Å to approximately 20 Å. Interfacial material 130 thicknesses below approximately 1 Å are also contemplated. The interfacial material 130 may be formed by conventional techniques, which are not described in detail herein, as long as the desired thickness is achieved. For instance, the interfacial material 130 may be formed by ALD, CVD, or other suitable process. However, the interfacial material 130 is not formed by techniques that consume or damage the underlying high-k dielectric material 120. The interfacial material 130 may be formed in a manner such that the interface between the interfacial material 130 and the high-k dielectric material 120 and the interface between the interfacial material 130 and the conductive material 140 are substantially continuous and abrupt. Without being bound by any particular theory, it is believed that forming the interfacial material 130 as a thin, uniform, continuous material, enables the interfacial material 130 to exhibit electrical properties more similar to those of the conductive material 140 than those of the high-k dielectric material 120. By way of non-limiting example, the interfacial material 130 is formed such that the interface between the interfacial material 130 and the high-k dielectric material 120 or the conductive material 140 is continuous. A discontinuous interface may result by forming the interfacial material 130 by chemical reactions between a high-k dielectric material 120 and a conductive material 140, such as during an annealing process, or any process where oxygen, or any other material, from the high-k dielectric material 120 migrates towards the conductive material 140, causing micro roughness at the interface between the materials. The presence of the interfacial material 130, particularly an interfacial material 130 formed by ALD, prevents such diffusion and micro roughness at the interface between the interfacial material 130 and the high-k dielectric material 120 or the conductive material 140.

In one embodiment, an ALD process may be used to form the interfacial material 130. The desired thickness of the interfacial material 130 may be achieved by performing between about one ALD deposition cycle and about eight ALD deposition cycles, such as between about one ALD deposition cycle and about four ALD deposition cycles, between about one ALD deposition cycle and about three ALD deposition cycles, or between about two ALD deposition cycles and about three ALD deposition cycles. The ALD process may be formed using an organometallic metal precursor of the interfacial material 130, rather than a halogen-containing metal precursor or any precursor that may react with or damage the high-k dielectric material 120 or other underlying materials. By way of non-limiting example, by using organometallic precursors that lack halogen atoms, reactions with and etching of the high-k dielectric material 120 may be prevented or substantially eliminated during formation of the interfacial material 130. By way of non-limiting example, the interfacial material 130 may be formed using an organometallic precursor including, but not limited to, tetrakis(dimethylamido)titanium (TDMAT), methylcyclopentadienyl tris(dimethylamino) titanium (TIMCTA), bis(diethylamido)-bis(dimethylamido)titanium, tetrakis(diethylamido)titanium, tetrakis (ethylmethylamido)titanium, titanium tert-butoxide, bis (tert-butylamido)bis(dimethylamido)tungsten, tungsten hexacarbonyl ($W(CO)_6$), niobium ethoxide, tert-butylamido-tris-(diethylamido)-niobium (TBTDEN), other niobium containing precursors (such as Nabal, commercially available from Air Liquide), molybdenum hexacarbonyl, pentakis(dimethylamido)tantalum, and tris(diethylamido) (tert-butylimido)tantalum. In one embodiment, the organometallic precursor is TDMAT or TIMCTA. Non-limiting examples of oxidizers that may be used with the organometallic precursors include at least one of $H_2O$, $O_3$, $O_2$, $H_2O_2$, NO, $N_2O$, $NO_2$, SO, or $SO_2$.

With continued reference to FIG. 1, the conductive material 140 may be formed over the interfacial material 130. The conductive material 140 may be formed by conventional techniques, which are not described in detail herein. Since the interfacial material 130 is configured to prevent metal precursors (such as halogen-containing metal precursors) from reacting with the high-k dielectric material 120, the conductive material 140 may be formed using precursors that would otherwise damage or react with the high-k dielectric material 120 (such as halogen-containing metal precursors). The interfacial material 130 may function as a barrier, preventing species from diffusing between the conductive material 140 and the high-k dielectric material 120. For example, the interfacial material 130 may be selected such that chemical reactions between the interfacial material 130 and the precursor of the conductive material 140 is not thermodynamically favorable at a temperature at which the conductive material 140 is formed. By way of non-limiting example, the interfacial material 130 may protect the underlying high-k dielectric material 120 from chemical reaction and etching during formation of a TiN conductive material, such as a top electrode formed from TiN using a $TiCl_4$ precursor. In addition, due to the presence of the interfacial material 130 over the high-k dielectric material 120, the conductive material 140 may be formed at an elevated temperature, such as at a temperature of greater than or equal to approximately 350° C.

The conductive material 140 may be selected, in combination with the interfacial material 130, depending on the desired electrical properties of the semiconductor structure 101. The conductive material 140 may be a metal nitride such as TiN, tantalum nitride (TaN), molybdenum nitride (MoN), tungsten nitride (WN, $W_2N$, $WN_2$), or niobium nitride (NbN). The conductive material 140 may be formed using a halogen-containing metal precursor, such as $TiCl_4$, $TiBr_4$, $TaCl_5$, $TaBr_5$, $TaF_5$, $NbCl_5$, $NbF_5$, $WF_6$, $WCl_6$, $MoCl_5$, $MoF_5$, and other halogen-containing metal precursors. In one embodiment, the metal of the conductive material 140 is selected to be the same as the metal of the interfacial material 130. For example, if the conductive material 140 is a nitride of titanium, tantalum, tungsten, molybdenum, or niobium, the interfacial material 130 is an oxide of the same metal, e.g., an oxide of titanium, tantalum, tungsten, molybdenum, or niobium, respectively. In one embodiment, the conductive material 140 is TiN and the interfacial material 130 is an oxide of titanium.

By selecting the metal of the interfacial material 130 and of the conductive material 140 to be the same, the band gap and the work function of the conductive material 140 and the interfacial material 130 may be tailored to one another. Without being bound by any particular theory, it is believed that matching the work function of the interfacial material 130 to the work function of the conductive material 140 causes the interfacial material 130 to behave in a similar manner (e.g., have similar properties) to the conductive material 140. Since the work function of a material may change depending on the material it is in contact with, it is believed that matching the respective work functions of the interfacial material 130 and the conductive material 140 helps to reduce the leakage current in the semiconductor structure 101. Without being bound by any particular theory, it is believed that due to the thickness of the interfacial material 130, the band gap of the interfacial material 130 may be lower than the band gap of the same material having a greater thickness. Thus, it is believed that by forming an ultra thin interfacial material 130 adjacent to the conductive material 140, the band gap of the conductive material 140 is not significantly altered. By way of non-limiting example, if the conductive material 140 of a capacitor is formed from TiN, an interfacial material 130 formed from $TiO_x$ (such as, for example, $TiO_2$) results in an increased capacitance of the stack structure 100 and reduced leakage current between the conductive material 140 and the high-k dielectric material 120. The $TiO_x$ interfacial material 130, thus, behaves more like the TiN than the high-k dielectric material 120 of the stack structure 100. In one embodiment, an interfacial material 130 with a higher work function than the conductive material 140 decreases the leakage current between the conductive material 140 and the high-k dielectric material 120. Although in some embodiments the metal of the interfacial material 130 and the metal of the conductive material 140 are selected to be the same metal, in other embodiments, the metal of the interfacial material 130 may be a different metal than the metal of the conductive material 140 and may be selected to have a similar or higher work function than that of the conductive material 140.

The interfacial material 130 may also be subjected to surface treatment processes, such as plasma, ultraviolet, decoupled plasma oxidation (DPO), decoupled plasma nitridation (DPN), or annealing processes in various environments to achieve the desired band gap and the work function of the material. Wet or dry chemical treatments may also be used to achieve the desired band gap and the work function of the interfacial material 130.

In one embodiment, the conductive material 140 may function as a top electrode of the gate stack or capacitor in a DRAM, MOSFET, CMOS, MIM, or other semiconductor device. In such applications, the stack structure 100 may exhibit a high capacitance. To form the conductive material 140 in a stack structure 100 with a high capacitance, the conductive material 140 may be formed using a halogen-containing metal precursor at an elevated temperature, such as at a temperature of greater than or equal to approximately 350° C. The conductive material 140 may be formed by CVD, ALD, or other conventional techniques at a temperature between about 350° C. and about 750° C. The halogen-containing precursor may be used to form the conductive material 140 without damaging the high-k dielectric material 120 because the interfacial material 130 prevents the halogen-containing metal precursor from contacting the high-k dielectric material 120 or the substrate 110. In one embodiment, a TiN conductive material 140 is formed from $TiCl_4$ and $NH_3$ precursors at a deposition temperature of approximately 550° C. This high formation temperature results in a TiN top electrode of stack structure 100 exhibiting a substantially higher capacitance than a TiN top electrode formed at a lower deposition temperature or formed with a metal precursor other than $TiCl_4$. The resulting stack structure 100 has a higher capacitance and minimal current leakage between the conductive material 140 and the high-k dielectric material 120.

The interfacial material 130 may be formed such that the interface between the interfacial material 130 and the conductive material 140 and the interface between the interfacial material 130 and the high-k dielectric material 120 is substantially abrupt. The conductive material 140 may be substantially free of the interfacial material 130 and the high-k dielectric material 120, the interfacial material 130 may be substantially free of the conductive material 140 and the high-k dielectric material 120, and the high-k dielectric material 120 may be substantially free of the interfacial material 130 and the conductive material 140. Thus, a gradient may not exist between the interfacial material 130 and the high-k dielectric material 120 or between the interfacial material 130 and the conductive material 140. It is believed that this abrupt interface between the conductive material 140 and the interfacial material 130 may reduce or prevent leakage current by preventing tunneling from the conductive material 140 to the high-k dielectric material 120. Forming the interfacial material 130 by ALD may be an effective method of creating the abrupt interface between the high-k dielectric material 120 and the conductive material 140. It is believed that using an organometallic precursor, which does not react with the high-k dielectric material 120 or the bulk substrate 110, creates a smooth heterojunction between the high-k dielectric material 120 and the conductive material 140. This prevents the formation of undesired metal oxides and suboxides dispersed non-uniformly throughout the high-k dielectric material 120 and the conductive material 140.

The material used as the interfacial material 130 may be selected to tailor the electrical properties of the stack structure 100, such as a stack used in a capacitor. The electrostatic potential of the semiconductor structure 101 including the interfacial material 130 may be tailored by forming one or more interfacial materials 130 between the conductive material 140 and the high-k dielectric material 120. The work function of the interfacial material 130 may be tailored to match or be higher than the work function of the conductive material 140, decreasing leakage current of the semiconductor structure 101. The interfacial material 130 thus may serve multiple functions by both reducing undesired chemical reactions during formation of the conductive material 140, and improving the electrical properties of the semiconductor structure 101 including the interfacial material 130.

It has been found that contacting a metal nitride conductive material with a thin metal oxide interfacial material 130 where the metal oxide and the metal nitride include the same metal improves the electrical properties of a stack structure 100 that includes the metal nitride and the metal oxide. The presence of the interfacial material 130 may alter the band offset of the conductive material 140 relative to the high-k dielectric material 120. If the band offset at the heterojunction between the high-k dielectric material 120 and the conductive material 140 is increased, the leakage current may be decreased. By way of non-limiting example, forming an interfacial material 130 of $TiO_x$ (such as, for example, $TiO_2$) between a $ZrO_x$ (such as, for example, $ZrO_2$) high-k dielectric material 120 and a TiN conductive material 140 may provide a higher band gap offset than a structure where the TiN conductive material 140 is in direct contact with the $ZrO_x$ high-k dielectric material 120. Thus, the presence of the $TiO_x$ interfacial material 130 may reduce leakage current between the TiN conductive material 140 and the $ZrO_x$ high-k dielectric material 120.

Conventionally, the presence of a metal oxide material between a metal nitride and a high-k dielectric material has been undesired and has been reported to cause a decrease in the capacitance of a capacitor. Surprisingly, however, when the interfacial material 130 is formed by embodiments of the present disclosure, the overall capacitance of the stack structure 100 is increased. Without being bound by any particular theory, it is believed that matching the work function of the interfacial material 130 with the work function of the conductive material 140 causes the interfacial material 130 and the conductive material 140 to function as a single material having similar properties. In one embodiment, the capacitance of a stack structure 100 is increased by approximately 5% by forming a $Ti_yO_x$ (such as, for example, $TiO_2$) interfacial material 130 between a high-k dielectric material 120 and the TiN top electrode.

Disclosed is a method of forming a semiconductor structure. The method comprises forming a high-k dielectric material, forming a continuous interfacial material over the high-k dielectric material, and forming a conductive material over the continuous interfacial material.

Also disclosed is a method of forming a semiconductor structure that comprises forming an interfacial material between a high-k dielectric material and a conductive material. The interfacial material is in contact with an entire upper surface of the high-k dielectric material.

Also disclosed is a semiconductor structure comprising a conductive material, a high-k dielectric material, and a continuous interfacial material between the conductive material and the high-k dielectric material.

The interfacial material may be utilized in various semiconductor devices, such as in a CMOS, MIM, or DRAM device. The presence of the interfacial material may increase device performance by increasing the capacitance, reducing leakage current and tunneling, and increasing the breakdown voltage of the device.

Disclosed is a capacitor comprising a high-k dielectric material over a bottom electrode, a top electrode comprising a metal nitride over the high-k dielectric material, and a continuous metal oxide material between the high-k dielectric material and the top electrode.

Also disclosed is a method of forming a capacitor comprising forming a high-k dielectric material over a bottom electrode, forming an interfacial material in direct contact with the high-k dielectric material, and forming a top electrode over the interfacial material. The interfacial material comprises the same metal as a metal of the top electrode.

Figure 2:
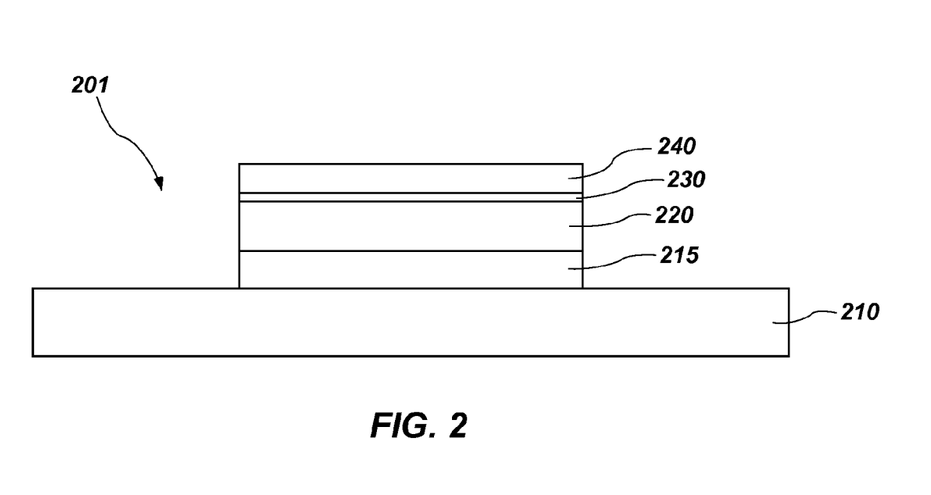
FIG. 2 is a cross-sectional view illustrating an interfacial material in a MIM device according to an embodiment of the present disclosure.

As shown in FIG. 2, a MIM device 201 including an interfacial material 230, a conductive material 240, and a high-k dielectric material 220 may be formed. The interfacial material 230, conductive material 240, and high-k dielectric material 220 are substantially as described above for interfacial material 130, conductive material 140, and high-k dielectric material 120 and may be formed substantially as described above in regard to FIG. 1. The high-k dielectric material 220 may be disposed over a substrate 210. It will be understood that there may be other materials (not shown) disposed between the substrate 210 and the high-k dielectric material 220. For example, there may be an optional capping material (not shown) between the high-k dielectric material 220 and the substrate 210. By forming the MIM device 201 with the interfacial material 230, the overall electrical performance of the MIM device 201 may be improved. The capacitance may be improved, leakage may be decreased, and the breakdown voltage may be increased. The MIM device 201 has a higher capacitance and less current leakage than a MIM device without such an interfacial material 230.

Figure 3:
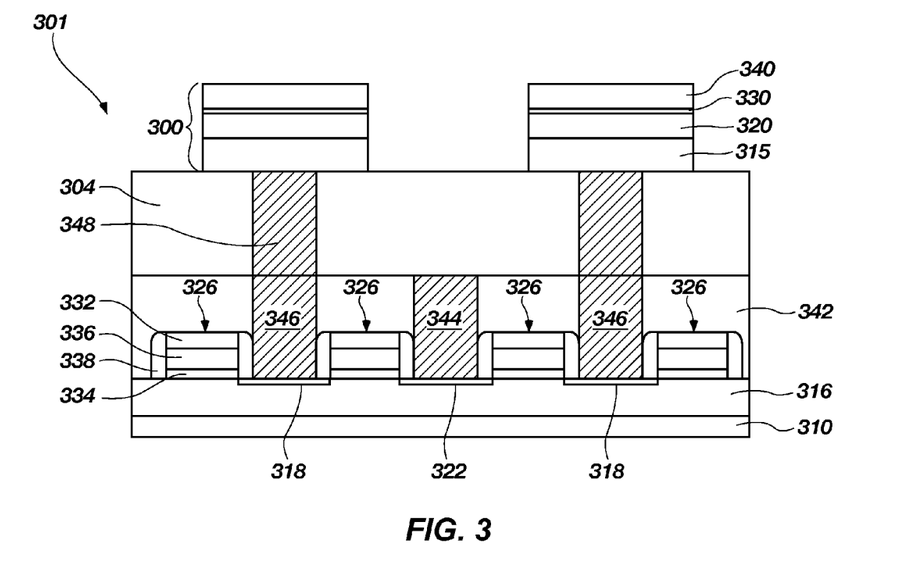
FIG. 3 is a cross-sectional view of a DRAM device including an interfacial material in a gate stack according to an embodiment of the present disclosure.

As shown in FIG. 3, a DRAM device 301 including an interfacial material 330, a conductive material 340 as a top electrode, and a high-k dielectric material 320 may be formed. The DRAM device 301 includes a capacitor structure 300. The DRAM device 301 includes a plurality of memory cells formed on a substrate 310. The memory cells include a well 316, drain regions 318, source regions 322, and gate stacks 326 formed on the substrate 310 according to conventional semiconductor processing techniques, which are not described in detail herein. The gate stacks 326 may include a gate oxide region 334, a conductive gate region 336, spacers 338, and a cap 332. A first insulating material 342 may be formed over the gate stacks 326 having bit contacts 344 and first capacitor contacts 346 formed therein. The bit contacts 344 may be in electrical communication with the source regions 322 and the first capacitor contacts 346 may be in electrical communication with the drain regions 318. A second insulating material 304 may be formed over the first insulating material 342 and the bit contacts 344 and second capacitor contacts 348 may be formed in the insulating material 304. The capacitor structures 300 are formed in electrical communication with the second capacitor contacts 348. The capacitor structures 300 include a bottom electrode 315, the high-k dielectric material 320, the interfacial material 330, and the conductive material 340. The interfacial material 330, conductive material 340, and high-k dielectric material 320 may be substantially as described above for interfacial material 130, conductive material 140, and high-k dielectric material 120 and may be formed substantially as described above in regard to FIG. 1.

The following example serves to explain embodiments of the present disclosure in more detail. The example is not to be construed as being exhaustive or exclusive as to the scope of the present disclosure.

EXAMPLE

A capacitor of a MIM device (similar to FIG. 2) having an interfacial material 230 was formed on a silicon substrate 210. A bottom electrode 215 was formed over the substrate 210. A zirconium oxide high-k dielectric material 220 was formed over the bottom electrode 215. An interfacial material 230 of $TiO_2$ was formed by ALD over the $ZrO_2$ high-k dielectric material 220. The $TiO_2$ was formed using TIMCTA as the organometallic precursor and at least one of $H_2O$ or $O_3$ precursors. A smooth and continuous interface was achieved between the $TiO_2$ interfacial material 230 and the $ZrO_2$ high-k dielectric material 220. A TiN metal electrode 240 was formed over the $TiO_2$ interfacial material 230. The TiN was deposited by performing three ALD cycles with TiCl$_4$ and NH$_3$ precursors at a deposition temperature of approximately 550° C.

The resulting MIM capacitor exhibited improved physical and electrical properties. Surprisingly, the capacitor formed in this example showed an increase in capacitance when compared to a similar capacitor lacking a TiO$_2$ interfacial material 230. Additionally, the capacitance of the top TiN metal electrode 240 increased by approximately 5% per cell when compared to a similar gate stack without a TiO$_2$ interfacial material 230. The gate stack with the TiO$_2$ interfacial material 230 exhibited a reduced leakage current between the TiN metal electrode and ZrO$_2$ high-k dielectric material 220. Finally, the breakdown voltage of the gate stack formed with the interfacial material 230 exhibited a higher breakdown voltage than the gate stack without the TiO$_2$ interfacial material 230.

While the present disclosure may be susceptible to various modifications and alternative forms, specific embodiments have been shown by way of example in the drawings and have been described in detail herein. However, the present disclosure is not intended to be limited to the particular forms disclosed. Rather, the present disclosure encompasses all modifications, equivalents, variations, and alternatives falling within the scope of the present disclosure as defined by the following appended claims and their legal equivalents.

What is claimed is:

1. A method of forming a semiconductor structure, comprising:
    forming a high-k dielectric material comprising zirconium oxide;
    forming a continuous interfacial material comprising an oxide or suboxide of titanium over the high-k dielectric material comprising zirconium oxide; and
        forming a titanium nitride material over the continuous interfacial material comprising the oxide or suboxide of titanium.

2. The method of claim 1, wherein forming a continuous interfacial material comprising an oxide or suboxide of titanium over the high-k dielectric material comprising zirconium oxide comprises forming the continuous interfacial material comprising the oxide or suboxide of titanium over the high-k dielectric material comprising zirconium oxide without using a halogen-containing metal precursor.

3. The method of claim 1, wherein forming a titanium nitride material over the continuous interfacial material comprising the oxide or suboxide of titanium comprises forming the titanium nitride material over the continuous interfacial material comprising the oxide or suboxide of titanium using a halogen-containing metal precursor.

4. The method of claim 1, wherein forming a continuous interfacial material comprising an oxide or suboxide of titanium over the high-k dielectric material comprising zirconium oxide comprises forming the continuous interfacial material comprising the oxide or suboxide of titanium by atomic layer deposition over the high-k dielectric material comprising zirconium oxide.

5. The method of claim 4, wherein forming the continuous interfacial material comprising the oxide or suboxide of titanium by atomic layer deposition over the high-k dielectric material comprising zirconium oxide comprises performing between one atomic layer deposition cycle and eight atomic layer deposition cycles.

6. The method of claim 1, further comprising forming a capping material between the high-k dielectric material comprising zirconium oxide and the continuous interfacial material comprising the oxide or suboxide of titanium.

7. The method of claim 1, wherein forming a titanium nitride material over the continuous interfacial material comprising the oxide or suboxide of titanium comprises forming the titanium nitride material over the continuous interfacial material comprising the oxide or suboxide of titanium at a temperature of greater than or equal to approximately 350° C.

8. The method of claim 1, wherein forming a titanium nitride material over the continuous interfacial material comprising the oxide or suboxide of titanium comprises forming the titanium nitride material over the continuous interfacial material comprising the oxide or suboxide of titanium by atomic layer deposition at a temperature of approximately 550° C.

9. A method of forming a semiconductor structure, comprising:
    forming an interfacial material between a high-k dielectric material and a titanium nitride material, the high-k dielectric material comprising zirconium oxide, and the interfacial material comprising an oxide or suboxide of titanium in contact with an entire upper surface of the high-k dielectric material.

10. The method of claim 9, wherein forming an interfacial material comprises forming the interfacial material comprising the oxide or suboxide of titanium by atomic layer deposition.

11. The method of claim 9, wherein forming an interfacial material comprises forming the oxide or suboxide of titanium using an organometallic precursor.

12. The method of claim 11, wherein forming the oxide or suboxide of titanium using an organometallic precursor comprises using an organometallic precursor selected from the group consisting of tetrakis(dimethylamido)titanium (TDMAT), methylcyclopentadienyl tris(dimethylamino)titanium (TIMCTA), bis(diethylamido)-bis(dimethylamido)titanium, tetrakis(diethylamido)titanium, tetrakis(ethylmethylamido)titanium, and titanium tert-butoxide.

13. The method of claim 9, wherein forming an interfacial material between a high-k dielectric material and a titanium nitride material comprises forming a continuous monolayer of the interfacial material comprising the oxide or suboxide of titanium between the high-k dielectric material and the titanium nitride material.

14. A semiconductor structure, comprising a titanium nitride material;
    a high-k dielectric material comprising zirconium oxide; and
    a continuous interfacial material comprising an oxide or suboxide of titanium between the titanium nitride material and the high-k dielectric material comprising zirconium oxide.

15. The semiconductor structure of claim 14, wherein the continuous interfacial material comprising an oxide or suboxide of titanium comprises titanium oxide or titanium suboxide at a thickness of from approximately 1 Å to approximately 20Å.

16. A method of forming a capacitor, comprising:
    forming a high-k dielectric material consisting of zirconium oxide directly over a bottom electrode;
    forming an interfacial material comprising an oxide or suboxide of titanium in direct contact with the high-k dielectric material consisting of zirconium oxide; and
    forming a top electrode comprising titanium over the interfacial material comprising the oxide or suboxide of titanium.

17. The method of claim 16, wherein forming an interfacial material comprising an oxide or suboxide of titanium in direct contact with the high-k dielectric material consisting of zirconium oxide comprises forming the oxide or suboxide of titanium using an organometallic precursor in direct contact with the high-k dielectric material consisting of zirconium oxide.

18. The method of claim 16, wherein forming a top electrode comprising titanium comprises forming a titanium nitride top electrode using $TiCl_4$.

19. The method of claim 16, wherein forming a top electrode comprising titanium comprises forming a titanium nitride top electrode by atomic layer deposition at a temperature of approximately 550° C.

20. The method of claim 16, wherein forming a top electrode comprising titanium over the interfacial material comprising the oxide or suboxide of titanium comprises forming a top electrode comprising TiN over the interfacial material comprising $TiO_2$.

21. A capacitor comprising:
   a high-k dielectric material consisting of zirconium oxide directly over a bottom electrode;
   a top electrode comprising titanium nitride over the high-k dielectric material; and
   a continuous titanium oxide material between the high-k dielectric material and the top electrode.

22. The capacitor of claim 21, wherein the continuous titanium oxide material comprises $TiO_2$.

* * * * *

UNITED STATES PATENT AND TRADEMARK OFFICE
CERTIFICATE OF CORRECTION

PATENT NO. : 9,536,940 B2  Page 1 of 1
APPLICATION NO. : 13/622667
DATED : January 3, 2017
INVENTOR(S) : Zhe Song and Jennifer K. Sigman It is certified that error appears in the above-identified patent and that said Letters Patent is hereby corrected as shown below:

In the Specification
  Column 3,    Line 37,    change "memory (RRAIVI)," to --(RRAM),--

In the Claims
Claim 15,    Column 12,   Line 58,    change "approximately 20Å" to --approximately 20 Å--

Signed and Sealed this
Fourth Day of April, 2017

Michelle K. Lee
*Director of the United States Patent and Trademark Office*